United States Patent
Kaiser et al.

(10) Patent No.: US 10,116,011 B2
(45) Date of Patent: Oct. 30, 2018

(54) SWITCHING DEVICE FOR AN ELECTROCHEMICAL ENERGY STORE AND ENERGY STORAGE SYSTEM

(71) Applicant: AIRBUS DEFENCE AND SPACE GMBH, Ottobrunn (DE)

(72) Inventors: Alexander Kaiser, Wellingen (DE); Alexander Ohnesorge, Brunnthal (DE); Michael Hofmann, Neubiberg (DE); Jürgen Steinwandel, Uhldingen (DE); Michael Pilawa, München (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 382 days.

(21) Appl. No.: 15/029,790

(22) PCT Filed: Oct. 14, 2014

(86) PCT No.: PCT/DE2014/000505
§ 371 (c)(1),
(2) Date: Apr. 15, 2016

(87) PCT Pub. No.: WO2015/055164
PCT Pub. Date: Apr. 23, 2015

(65) Prior Publication Data
US 2016/0240895 A1    Aug. 18, 2016

(30) Foreign Application Priority Data
Oct. 17, 2013   (DE) .......................... 10 2013 017 228

(51) Int. Cl.
*H01M 4/02*    (2006.01)
*H01M 10/42*   (2006.01)
(Continued)

(52) U.S. Cl.
CPC .... *H01M 10/4257* (2013.01); *H01L 51/0545* (2013.01); *H01M 10/425* (2013.01);
(Continued)

(58) Field of Classification Search
CPC ....................................................... H01M 4/02
See application file for complete search history.

(56) References Cited

U.S. PATENT DOCUMENTS

| 2012/0062167 | A1* | 3/2012 | Hachiya | B60L 11/1868 320/103 |
|---|---|---|---|---|
| 2014/0077595 | A1 | 3/2014 | Kakuya et al. | |
| 2016/0240895 | A1 | 8/2016 | Kaiser et al. | |

FOREIGN PATENT DOCUMENTS

| CN | 1318211 A | 10/2001 |
|---|---|---|
| CN | 1655377 A | 8/2005 |

(Continued)

OTHER PUBLICATIONS

German Patent Office, German Office Action for German Application No. DE 10 2013 017 228.4 dated Jul. 14, 2014.
(Continued)

*Primary Examiner* — Jacob B Marks
(74) *Attorney, Agent, or Firm* — Lorenz & Kopf, LLP

(57) ABSTRACT

The embodiments relate to a switch device for an electrochemical energy store having: a film transistor device that comprises at least one organic transistor, can be mounted in a planar manner on at least one electrode of the electrochemical energy store, can be controlled by an external voltage source, and is designed in the form of a controllable electrical resistor that is connected, in series, to an internal resistor of said electrochemical energy store.

20 Claims, 2 Drawing Sheets

(51) Int. Cl.
H01M 10/44 (2006.01)
H01L 51/05 (2006.01)
H02J 7/00 (2006.01)

(52) U.S. Cl.
CPC ........... H01M 10/44 (2013.01); H02J 7/0031 (2013.01); *H01M 2010/4271* (2013.01); *H01M 2220/20* (2013.01)

(56) References Cited

FOREIGN PATENT DOCUMENTS

| | | | |
|---|---|---|---|
| CN | 101140316 | A | 3/2008 |
| DE | 102008022469 | A1 | 11/2008 |
| DE | 102012200508 | A1 | 7/2013 |
| EP | 2 081 275 | A1 | 7/2009 |
| GB | 2 465 122 | A | 5/2010 |
| JP | 2008282633 | A | 11/2008 |
| JP | 2012253862 | A | 12/2012 |
| WO | 0007276 | A2 | 2/2000 |
| WO | 0016429 | A1 | 3/2000 |
| WO | 2012165197 | A1 | 12/2012 |
| WO | 2013017170 | A1 | 2/2013 |
| WO | 2013149947 | A1 | 10/2013 |

OTHER PUBLICATIONS

State Intellectual Property Office, P.R. China, First Office Action for Chinese Patent Application No. 201480069394.4 dated Feb. 2, 2018.

International Searching Authority, International Search Report for International Application No. PCT/DE2014/000505 dated Jan. 21, 2015.

* cited by examiner

SWITCHING DEVICE FOR AN ELECTROCHEMICAL ENERGY STORE AND ENERGY STORAGE SYSTEM

CROSS-REFERENCE TO RELATED APPLICATIONS

This is a continuation of International Application No. PCT/DE2014/000404, filed Oct. 14, 2014, which application claims priority to German Application No. 10 2013 017 228.4, filed Oct. 17, 2013, which are hereby incorporated by reference in their entirety.

TECHNICAL FIELD

The embodiments described herein relate to a switching device for an electrochemical energy store, and energy store and, an energy storage system.

BACKGROUND

In addition, other objects, desirable features and characteristics will become apparent from the subsequent summary and detailed description, and the appended claims, taken in conjunction with the accompanying drawings and this background.

Document DE 1 952 984 9 A1 describes electrochemical cells with a protective device that have at least two electrodes with the same polarity connected in parallel, serving as energy stores with high energy density, such as are used in electric road vehicles.

With the protective device described therein, the electrochemical cells are protected from bursting and/or the total failure of entire cells, and in certain cases damage to the cells is reported, wherein at least two electrodes connected in parallel and having the same polarity are present, wherein each of the single electrodes connected in parallel and having the same polarity is connected to a safety element.

The safety element described therein interrupts the electrical contact between the single electrodes and the current collector that connects the single electrodes when a threshold current value is exceeded, and they possess a detecting means that reports the actuation of a safety element outside of the cell.

DE 29 17 328 C3 describes a galvanic element with a fuse.

SUMMARY

There is a need to provide a safety function for an electrical energy store.

According to one embodiment, a switching device for an electrochemical energy store is provided, which switching device comprises a film transistor device that has at least one organic transistor, and that can be applied in a planar manner on least one electrode of the electrochemical energy store, that can be controlled by an external voltage source, and is designed in the form of a controllable electrical resistor that is connected in series to an internal resistor of the electrochemical energy store.

One approach for electrochemical energy stores, i.e., batteries or rechargeable batteries, is to make it possible to shut off the current flow, so that the current flow through the cell or the electrochemical energy store can be interrupted in the event of a fault, caused for example by a short circuit inside or outside of the system.

The idea comprises integrating one or more organic transistors in the form of a film on one or both electrodes that is switchable by an external voltage source with the combined battery system, so that the resistance of the organic transistor that is connected in series with the residual internal resistance of the cell can be switched selectively via an externally applied voltage. That is to say, the cell is switched to low-Ohm or high-Ohm resistance. A defined conductance, for deliberately generating dissipated heat, for example, may also be created. The switch must be integrated in the electron pathway in such manner that no adverse interactions with other components of the battery cell occur.

According to an advantageous embodiment, it is provided that the film transistor device is designed to be arranged inside a cell of the electrochemical energy store. This enables a compact construction of the electrochemical energy store with an integrated switch device.

According to a further advantageous embodiment the switching device also includes a control device that determines the currently predominant internal resistance of the electrochemical energy store, and on the basis of the determined internal resistance to set a total resistance of the internal resistance and the controllable electrical resistance that is connected in series. This enables the internal resistance to be adapted simply, and without interaction with the galvanic cell.

According to a still further advantageous embodiment, the film transistor device is spatially separated from an active material of the electrode. This advantageously makes it possible to prevent a chemical reaction between active material and the film transistor device.

According to yet a further advantageous embodiment the organic transistor is arranged between at least two metal films. This enables the organic transistor to be advantageously contacted directly.

According to a further advantageous embodiment the at least one organic transistor of the film transistor device is in the form of an organic field effect transistor. Consequently, the structure of the film transistor device may be simple and compact.

According to a another advantageous embodiment the organic field effect transistor is designed in a vertical arrangement.

In yet a further advantageous embodiment, it is provided that the organic field effect transistor is designed in a horizontal arrangement.

According to yet another further advantageous embodiment the organic field effect transistor has source and drain areas, each of which is furnished with meshing contact fingers. In this way, reliable, powerful current paths may be provided for contacting the organic layer.

According to another advantageous embodiment the film transistor device is designed such that it may be applied to the at least one electrode of the electrochemical energy store by means of a printing process. This advantageously enables the film transistor device to be produced simply and inexpensively.

According to a further advantageous embodiment an the film transistor device substantially corresponds to an areal extent of the electrode.

According to a further advantageous embodiment the film transistor device has a flexible structure.

The variants and embodiments described may be used in any combination with each other.

Further possible variants, developments and implementations also include combinations, that are not explicitly declared, of features that are described in the preceding text or in the following text with regard to the exemplary embodiments.

BRIEF DESCRIPTION OF THE DRAWINGS

The various embodiments will hereinafter be described in conjunction with the following drawing figures, wherein like numerals denote like elements, and:

The accompanying drawings are intended to convey a more complete understanding of the embodiments. They illustrate embodiments, and in conjunction with the description they serve to explain the principles and concepts of the embodiments.

Figure 1:
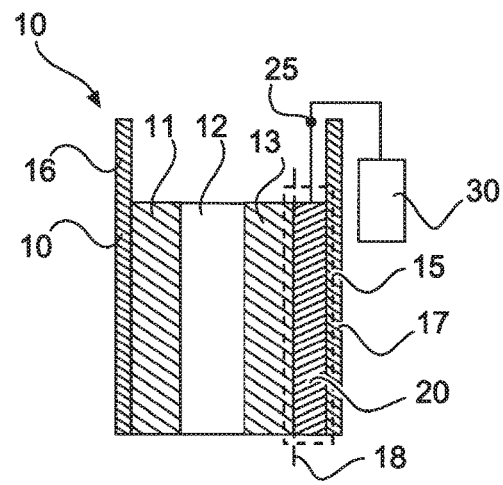

Other embodiments and many of the advantages described will be apparent from a review of the drawings. The elements represented in the drawings are not necessarily shown to the same scale as each other.

Figures 2, 3:
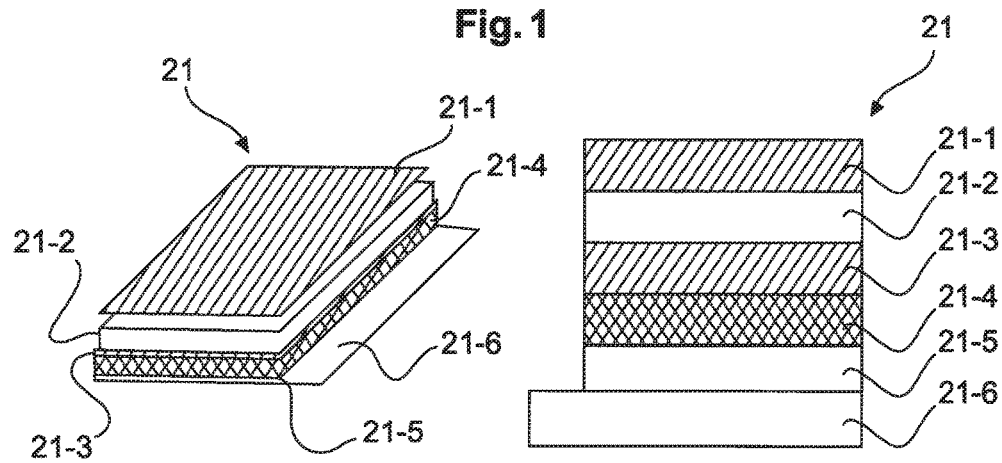
Figure 4:
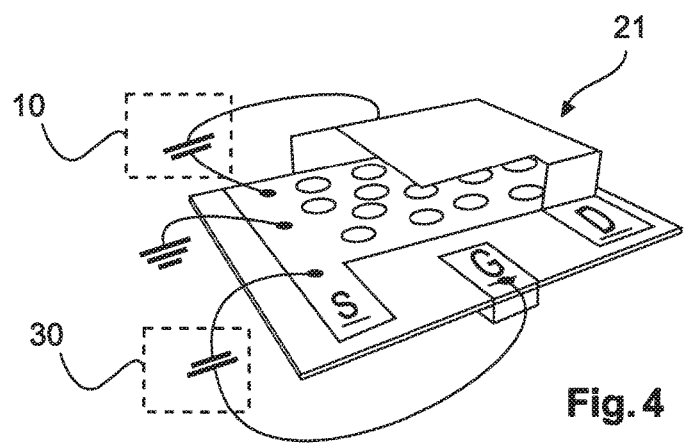
Figure 5:
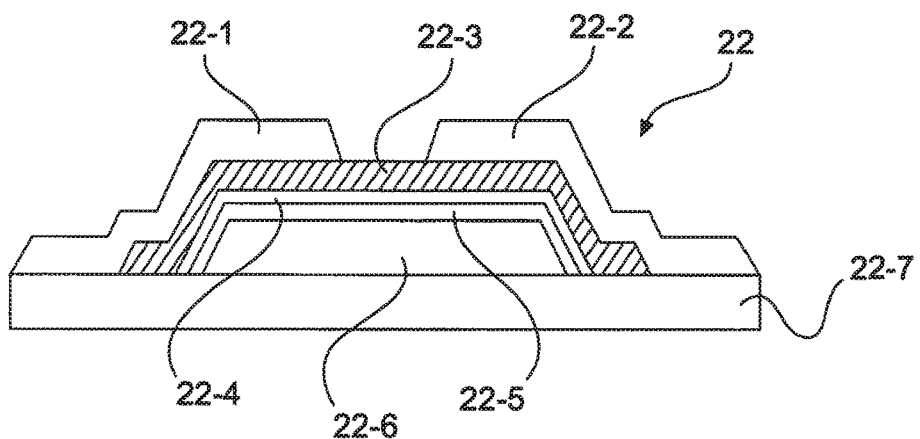
Figure 6:
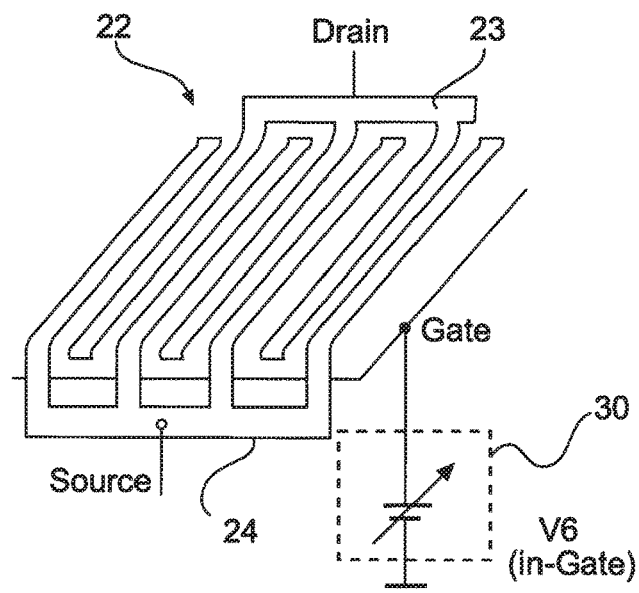
Figure 7:
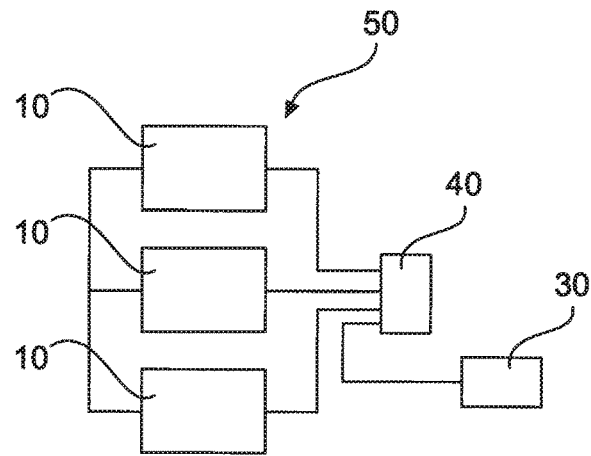

FIG. 1 is a schematic representation of a switching device for an electrochemical energy store according to an embodiment;

FIG. 2 is a schematic representation of a vertical organic transistor to explain the embodiment;

FIG. 3 is a schematic representation of a vertical organic transistor for explaining the embodiment;

FIG. 4 is a schematic representation of a switching device for an electrochemical energy store according to an embodiment;

FIG. 5 is a schematic representation of a horizontal organic transistor to explain the embodiment;

FIG. 6 is a schematic representation of a switching device for an electrochemical energy store according to a further embodiment; and FIG. 7 is a schematic representation of an energy storage system according to a further embodiment.

DETAILED DESCRIPTION

The following detailed description is merely exemplary in nature and is not intended to limit the disclosed embodiments or the application and uses thereof. Furthermore, there is no intention to be bound by any theory presented in the preceding background detailed description.

In the drawings, unless otherwise indicated, the same reference signs designate identical or functionally identical elements, parts, components or process steps.

FIG. 1 is a schematic representation of a switching device for an electrochemical energy store according to an embodiment.

Switching device 15 for the electrochemical energy store 10 comprises a film transistor device 20.

Film transistor device 20 may be applied to the rear of a current collector 16, 17 of an electrode of the electrical energy store 10, wherein the current collector is in the form of a carrier film. In this way, it is ensured that there can be no reactions between the (organic) transistor material and the active material 11, 13 of the electrode, the electrolyte, or other constituents of energy store 10.

A separating surface 18 of film transistor device 20 may have the form of a metal or electrical conductive film or layer, mechanically separating the active material 11, 13 and the electrolyte from film transistor device 20, in other words preventing a substance or mass flow through separating surface 18.

A separator 12 of electrical energy store 10 may be constructed as an intermediate layer in the form of an ion-permeable film, and may be impregnated with an electrolyte.

In an advantageous variant, to provide a further electron conductive film interposed between the organic field effect transistor 20 or 21, 22 and the active material 11, 13 for this purpose.

The film transistor device may include at least one organic transistor 21, 22 and may be applied in planar manner inside the layer system of at least one electrode of electrochemical energy store 10, wherein the electrode of the energy store typically comprises a combination of current collector, active material, binder, and other constituents as necessary.

A control or gate voltage may be applied to organic transistor 21, 22 via a connector 25 to an external voltage source 30. With this, it is possible to actuate organic transistor 21, 22 and control an internal resistance of electrochemical energy store 10 in the form of a controllable electrical resistor.

In this context, organic transistor 21, 22 is coupled in series, with the internal resistance of electrical energy store 10 for example. Additionally, a further organic transistor 21, 22 may be coupled in parallel with the internal resistance of electrical energy store 10 to enable the electrical energy store 10 to be bypassed.

It is also conceivable to encapsulate organic transistor 21, 22, for example between two layers of metal film. In the case of a direct connection between organic transistor 21, 22 and an active material of the cell, it must be ensured that the carrier film of organic transistor 21, 22 used is resistant to the electrolyte or other substances contained in electrochemical energy store 10.

FIG. 2 shows a schematic representation of a vertical organic transistor in accordance with the embodiment.

The vertical configuration of organic transistor 21 comprises, for example, a layer system with a first layer, which is designed for example as an aluminium film and that represents a drain electrode 21-1 of organic transistor 21. Additionally, a second layer may be designed as a layer 21-2 with organic electronic material, for example or an organic semiconductor such as pentacene, for example. A third layer may in turn have the form of an aluminium film, representing a source electrode 21-3 of organic transistor 21. A fourth layer 21-4 may have the form of a lithium fluoride layer. A fifth layer may be an aluminium film again, representing a gate electrode 21-5 of organic transistor 21. A sixth layer may be a glass carrier substrate or a carrier film 21-6.

The current feedthrough through the substrate and the carrier film, respectively, may be assured by defined current paths, e.g. carbon fibres. Additionally, the carrier film itself may be conductive, aluminium film, for example, as shown in FIG. 2.

Organic transistor 21, 22 of transistor device 20 may be applied to the carrier film in a printing process using an inkjet film printer, for example.

The 'on' state resistance of an OFET is greater than that of crystalline field effect transistors and may be compensated, for example, by the formation of an enlarged areal extent of the OFET, which may extend effectively as far as the surface of the carrier film used. Essentially, this may mean that, for example, 95% of the surface of the carrier film used is reached.

If it is positioned on a separate carrier film, a contact may be established between transistor 21, 22 of transistor device 20 and one of the cell electrodes; for example, by compacting or other methods used in cell manufacture. Alternatively, it may be applied directly to the rear of a film that is used to create contacts for an electrode, for example.

Organic transistor 21, 22 of transistor device 20 may be applied to the carrier film in a printing operation with an inkjet film printer, for example. Film transistor device 20 may be applied to the rear of a current collector 16, 17 of an electrode of electrical energy store 10, which current collector is designed as a carrier film.

The electrode of electrical energy store 10 is comprised of, for example, a current collector, active materials, and further additives.

Through the use of flexible materials in the manufacture of OFETs, the OFETs can be processed easily during cell production, for example by an automatic coiling machine for electrodes. Compared with solid materials such as glass or ceramic, they also offer a certain mobility in the event of micro-movements inside the cell, which may be caused, for example, by thermal expansion phenomena or by fluctuating pressure or voltage ratios that occur for example when the electrochemical energy 10 store is charged or discharged.

FIG. 3 is a cross section through the vertical organic transistor 21 described previously in FIG. 2.

The other reference signs in FIG. 3 have been described previously, in the description of FIG. 2, and will therefore not be explained further here.

FIG. 4 is a schematic representation of a switching device for an electrochemical energy store according to a further embodiment.

Switching device 15 for electrochemical energy store 10 comprises a vertical organic transistor of film transistor device 20. Switching device 15 is coupled to the electrochemical energy store 10 and an external voltage source 30. In this way, switching device 15 is controllable by a control voltage which is generated by external voltage source 30 and applied via a gate electrode.

In the vertical configuration or the vertical structure, the current flows through the activated transistor 21, 22, that is to say from drain to source. The gate is the control connection via which transistor 21, 22 is switched. If the carrier film to which the transistor structure is applied is conductive, the current can flow directly into the film.

Accordingly, this structure may be manufacture over large expanses on films. Contact with the drain may be created with a further conducting film. That is positioned on top of the transistor structure and for which the contact is produced by compacting or other methods.

FIG. 5 is a schematic representation of a horizontal organic transistor.

Organic transistor 21, 22 may be in a vertical arrangement or in the form of a horizontal arrangement. In a horizontal arrangement, the current path is aligned parallel to the carrier film. In this case, a conductive structure is needed in order to create contact with the OFET. One possible horizontal arrangement is illustrated in FIG. 5.

The organic transistor 22 in horizontal arrangement comprises, for example, a layer system having a first layer, that is in the form of aluminium film, for example, and represents a drain electrode 22-1 of the organic transistor 22. A second layer may in turn be in the form of an aluminium film, representing a source electrode 22-2 of the organic transistor 22. Additionally, a third layer may be designed, for example, as a layer 22-3 with organic electronic material or an organic semiconductor, such as pentacene. A fourth layer 22-4 may be designed as a dielectric layer, for instance a self-assembled monolayer (SAM) or aluminium oxide.

A fifth layer 22-5 may again be in the form of an aluminium film, representing a gate electrode 22-6 of the organic transistor 22, and a further metal intermediate layer 22-6 may be present as the sixth layer.

Organic transistor 22 may further be arranged on a carrier film layer 22-7. This layer may be designed such that it is not entirely conductive.

FIG. 6 shows a schematic representation of a switching device for an electrochemical energy store according to a further embodiment.

Organic field effect transistor 22 may include source and drain areas, each of which is furnished with a plurality of meshing contact fingers. A drain contact finger 23 and a source contact finger 24 are mutually interlocked on the same carrier film. The OFET is arranged between the fingers. The carrier film also serves as a separator from the gate. Switching device 15 is coupled to an external voltage source 30.

Other arrangements and variations of the contact system are also possible, differing from the meshed fingers shown, provided that such arrangements and variations achieve the same result with regard to switching.

Thus, for example, any other interlocking structure may be used instead of the finger structure shown.

The switching device may also be used as a circuit breaker that prevents the flow of current in the cell in the event of a fault. Since this takes place inside the cell connectors that can be accessed from the outside, a defective cell can also be bypassed by means of a parallel branch.

If multiple cells equipped in this way are switched in series to form a string, and if each of the cells is individually actuatable, the overall voltage of the string in conjunction with the additionally switchable bypass path of the respective cell may be set with the step width of a cell voltage as a further benefit.

FIG. 7 is a schematic representation of an energy storage system according to a further embodiment.

Energy storage system 50 comprises, for example, at least two electrochemical energy stores 10, and at least one voltage source 30 and a control device 40, which is designed to be able to set an output voltage of the energy storage system with the aid of the switching devices 15 of the electrical energy stores 10.

The at least two electrochemical energy stores 10 may be connected together in parallel or in series or in any other feasible manner to form a string.

When actuated in corresponding manner, a graduated half-wave may be represented by the controlled connection of the string. The battery may thus be used as a controllable voltage source. If there are sufficient cells, it is therefore also possible to produce a near-sinusoidal output voltage.

The actuation of the transistor installed in the cell and, under certain circumstances where a second, external or internal bypass transistor if provided, is performed advantageously via the battery management system that is essential for lithium cells, since this is already located on the potential of the respective cell, and the corresponding functionalities are also present.

Although the present embodiments have been described with reference to preferred exemplary embodiments in the preceding text, it is not limited thereto, but instead can be modified in many different ways. In particular, the embodiment can be adapted or modified in a wide range of ways without departing from it is essential principles For the sake of completeness, it should be noted that the terms "comprising" and "including" do not exclude other elements or steps, and "one" or "a" does not exclude a plurality. It should further be noted that features or steps that have been described with an explicit reference to one of the preceding exemplary embodiments may also be used in combination with other features or steps of other exemplary embodiments described above. Reference signs in the claims are not to be construed as limiting.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the embodiment in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the embodiment as set forth in the appended claims and their legal equivalents.

What is claimed is:

1. A switching device for an electrochemical energy store, with: a film transistor device, which includes at least one organic transistor and which is attachable in planar manner to at least one electrode of the electrochemical energy store, and which is controllable by an external voltage source and is configured as a controllable electrical resistor in series with an in internal resistance of the electrochemical energy store.

2. The switching device of claim 1, wherein the film transistor device is configured to be arranged in a cell of the electrochemical energy store.

3. The switching device of claim 1, wherein the switching device further includes a control device which is configured to determine the currently predominant internal resistance of the electrochemical energy store, and on the basis of the determined internal resistance to set a total resistance of the internal resistance and the controllable electrical resistance that is connected in series.

4. The switching device of claim 1, wherein the film transistor device is spatially separated from an active material of the electrode.

5. The switching device of claim 1, wherein the organic transistor is arranged between at least two metal films.

6. The switching device of claim 1, wherein the at least one organic transistor of the film transistor device is configured as an organic field effect transistor.

7. The switching device of claim 6, wherein the organic field effect transistor is configured in a vertical arrangement.

8. The switching device of claim 6, wherein the organic field effect transistor is configured in a horizontal arrangement.

9. The switching device of claim 6, wherein the organic field effect transistor has source and drain areas, each of which is furnished with meshing contact fingers or an electrically suitable circuitry.

10. The switching device of claim 1, wherein the film transistor device is configured to be attached to the at least one electrode of the electrochemical energy store by means of a printing process.

11. The switching device of claim 1, wherein an areal extent of the film transistor device substantially corresponds to an areal extent of the electrode.

12. The switching device of claim 1, wherein the film transistor device has a flexible structure.

13. A electrochemical energy store with a switching device of claim 1.

14. A energy storage system with at least two electrochemical energy stores of claim 13 and at least one voltage source.

15. The energy storage system of claim 14, having a control device that is configured to set an output voltage of the energy storage system using the switching devices of the electrical energy stores.

16. A switching device for an electrochemical energy store, comprising:
    a film transistor device including at least one organic transistor and which attachable in a planar manner to at least one electrode of the electrochemical energy store; and
    an external voltage source, configured as a controllable electrode resistor; and
    an internal resistance in series with the controllable electrode resistor of the electrochemical energy store,
    wherein the film transistor is arranged in a cell of the electrochemical energy store.

17. The switching device of claim 16, wherein the switching device further includes a control device which is configured to determine the currently predominant internal resistance of the electrochemical energy store, and on the basis of the determined internal resistance to set a total resistance of the internal resistance and the controllable electrical resistance that is connected in series.

18. The switching device of claim 17, wherein the film transistor device is spatially separated from an active material of the electrode,
    wherein the organic transistor is arranged between at least two metal films; and
    wherein the at least one organic transistor of the film transistor device is configured as an organic field effect transistor.

19. The switching device of claim 17, wherein the organic field effect transistor is configured in a vertical arrangement.

20. The switching device of claim 17, wherein the film transistor device is configured to be attached to the at least one electrode of the electrochemical energy store by means of a printing process;
    wherein an areal extent of the film transistor device substantially corresponds to an areal extent of the electrode; and
    wherein the film transistor device has a flexible structure.

* * * * *